US007011980B1

(12) United States Patent
Na et al.

(10) Patent No.: US 7,011,980 B1
(45) Date of Patent: Mar. 14, 2006

(54) METHOD AND STRUCTURES FOR MEASURING GATE TUNNELING LEAKAGE PARAMETERS OF FIELD EFFECT TRANSISTORS

(75) Inventors: Myung-Hee Na, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,351

(22) Filed: May 9, 2005

(51) Int. Cl.
*H01L 21/66* (2006.01)

(52) U.S. Cl. .......................................... 438/17; 257/48

(58) Field of Classification Search .................... 438/5, 438/7, 10–11, 14, 16–18, 22–24, 29, 31, 34–36, 438/128–130, 149, 484, 538; 257/48
See application file for complete search history.

(56) References Cited

U.S. PATENT DOCUMENTS 5,930,620 A 7/1999 Wristers et al.
6,074,886 A * 6/2000 Henaux ...................... 438/17
6,281,593 B1 8/2001 Brown et al.
6,300,206 B1 * 10/2001 Fukada et al. ............. 438/303
6,358,819 B1 3/2002 Shelton et al.
6,500,715 B1 12/2002 Matsuzaki et al.
6,528,387 B1 * 3/2003 Moriyasu et al. ........... 438/404
6,664,589 B1 12/2003 Forbes et al.
6,677,645 B1 1/2004 Bryant et al.
6,713,353 B1 3/2004 Kanda et al.
6,756,635 B1 6/2004 Yasuda et al.
6,808,972 B1 * 10/2004 Sirringhaus et al. ........ 438/200

FOREIGN PATENT DOCUMENTS

EP 0831524 A1 3/1998
JP 6021369 A 1/1994

* cited by examiner

*Primary Examiner*—Michael Lebentritt
*Assistant Examiner*—Andre' C. Stevenson
(74) *Attorney, Agent, or Firm*—Schmeiser, Olsen & Watts; Anthony J. Canale

(57) ABSTRACT

A structure and method for measuring leakage current. The structure includes: a body formed in a semiconductor substrate; a dielectric layer on a top surface of the silicon body; and a conductive layer on a top surface of the dielectric layer, a first region of the dielectric layer having a first thickness and a second region of the dielectric layer between the conductive layer and the top surface of the body having a second thickness, the second thickness different from the first thickness. The method includes, providing two of the above structures having different areas of first and the same area of second or having different areas of second and the same area of first dielectric regions, measuring a current between the conductive layer and the body for each structure and calculating a gate tunneling leakage current based on the current measurements and dielectric layer areas of the two devices.

33 Claims, 7 Drawing Sheets

METHOD AND STRUCTURES FOR MEASURING GATE TUNNELING LEAKAGE PARAMETERS OF FIELD EFFECT TRANSISTORS

FIELD OF THE INVENTION

The present invention relates to the field of semiconductor transistors; more specifically, it relates to a silicon-on-insulator field effect transistor and a structure and method for measuring gate-tunnel leakage parameters of field effect transistors.

BACKGROUND OF THE INVENTION

Silicon-on-insulator (SOI) technology employs a layer of mono-crystalline silicon overlaying an insulation layer on a supporting bulk silicon wafer. Field effect transistors (FETs) are fabricated in the silicon layer. SOI technology makes possible certain performance advantages, such as a reduction in parasitic junction capacitance, useful in the semiconductor industry.

To accurately model SOI FET behavior, gate tunneling current from the gate to the body of the FET in the channel region must be accurately determined. This current is difficult to measure because construction of body-contacted SOI FETs utilize relatively large areas of non-channel region dielectric which adds parasitic leakage current from the gate to non-channel regions of the FET. The parasitic leakage current can exceed the channel region leakage current, making accurate modeling impossible.

Therefore, there is a need for a silicon-on-insulator field effect transistor with reduced non-channel gate to body leakage and a structure and method for measuring tunnel leakage current of a silicon-on-insulator field effect transistors.

SUMMARY OF THE INVENTION

The present invention utilizes SOI FETs having both thin and thick dielectric regions under the same gate electrode, the thick dielectric layer disposed adjacent to under the gate electrode over the SOI FET body contact, as tunneling leakage current measurement devices. The thick dielectric layer minimizes parasitic tunneling leakage currents that otherwise interfere with thin dielectric tunneling current measurements from the gate electrode in the channel region of the SOI FET.

A first aspect of the present invention is a structure comprising: a silicon body formed in a semiconductor substrate; a dielectric layer on a top surface of the silicon body; and a conductive layer on a top surface of the dielectric layer, a first region of the dielectric layer between the conductive layer and the top surface of the silicon body having a first thickness and a second region of the dielectric layer between the conductive layer and the top surface of the silicon body having a second thickness, the second thickness different from the first thickness.

A second aspect of the present invention is a method of measuring leakage current, comprising: providing a first and a second device, each device comprising: a silicon body formed in a semiconductor substrate; a dielectric layer on a top surface of the silicon body, a first region of the dielectric layer having a first thickness and a second region of the dielectric layer having a second thickness, the first thickness less than the second thickness; a conductive layer on a top surface of the dielectric layer; a dielectric isolation extending from a top surface of the semiconductor substrate into the semiconductor substrate on all sides of the silicon body; a buried dielectric layer in the semiconductor substrate under the silicon body, the dielectric isolation contacting the buried dielectric layer; a first region of the conductive layer extending in a first direction and a second region of the conductive layer extending in a second direction, the second direction perpendicular to the first direction; and the first region of the conductive layer disposed over the first region of the dielectric layer and an adjacent first portion of the second region of the dielectric layer, the second region of the conductive layer disposed over a second portion of the second region of the dielectric layer, the second portion of the second region of the dielectric layer adjacent to the first portion of the second region of the dielectric layer; and performing measurements of current flow between the conductive layer and the silicon body for each of the first and second devices.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
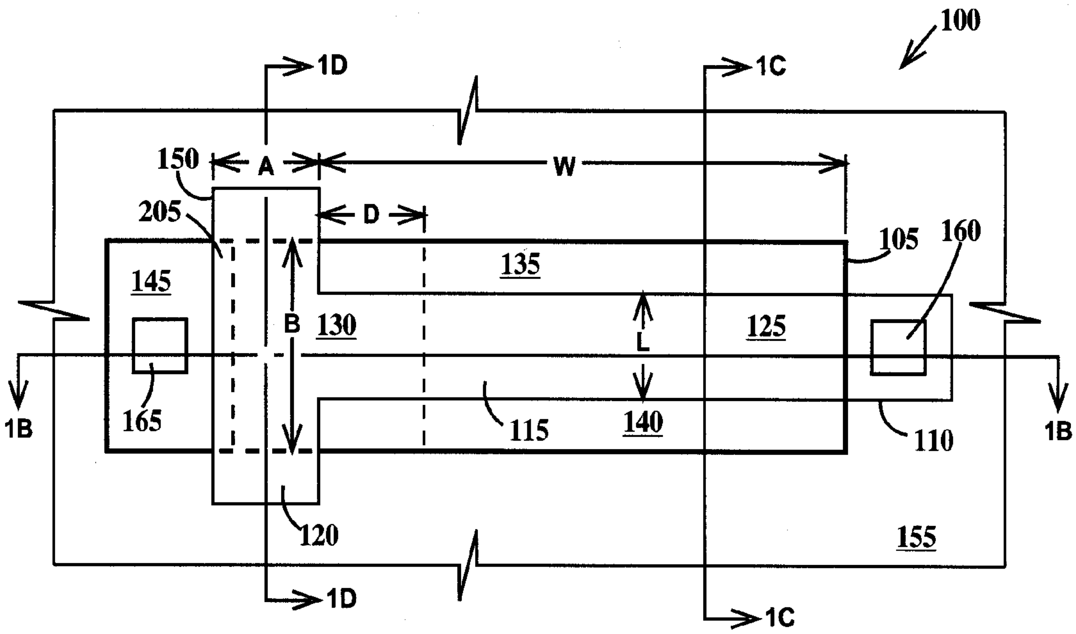
FIG. 1A is a top view of an SOI FET according to first and second embodiments of the present invention.

FIG. 1A is a top view of an SOI FET according to first and second embodiments of the present invention. In FIG. 1A, an FET 100 includes a silicon body 105, a “T” shaped conductive layer 110 having a first region 115 and a integral second region 120 perpendicular to first region 115, and a dielectric layer (e.g. a gate dielectric layer), a thin dielectric region 125 (e.g. a thin gate dielectric region) and a thick dielectric region 130 (e.g. a thick gate dielectric region). Thick dielectric region 130 is shown by the dashed lines. Thin and thick dielectric regions 125 and 130 may formed from a single integral dielectric layer, from two separate but abutting dielectric layers or thick region 130 may include a second dielectric layer over an underlying first dielectric layer while thin region 125 just includes the second dielectric layer. First and second source/drains 135 and 140 are formed in body 105 on opposite sides of first region 115 of conductive layer 110. A body contact region 145 is formed in body 105 adjacent to a side 150 of second region 120 of gate 110 away from first region 115 of gate 110. Body 105 is surrounded by trench isolation (TI) 155. A first stud contact 160 contacts gate 110 and a second stud contact 165 contacts body contact region 145 of body 105.

For an N-channel FET (NFET) device body 105 is doped P− except for first and second source/drain regions 135 and 140 which are doped N+ and body contact region 145 which is doped P+. For a P-channel FET (PFET) device body 105 is doped N− except for first and second source/drain regions 135 and 140 which are doped P+ and body contact region 145 which is doped N+.

First region 115 of conductive layer 110 has a width W and a length L. Thick dielectric region 130 extends from second region 120 of conductive layer 110 a distance D (e.g. has a width D) under first region 115 of conductive layer 110.

Figure 1B:
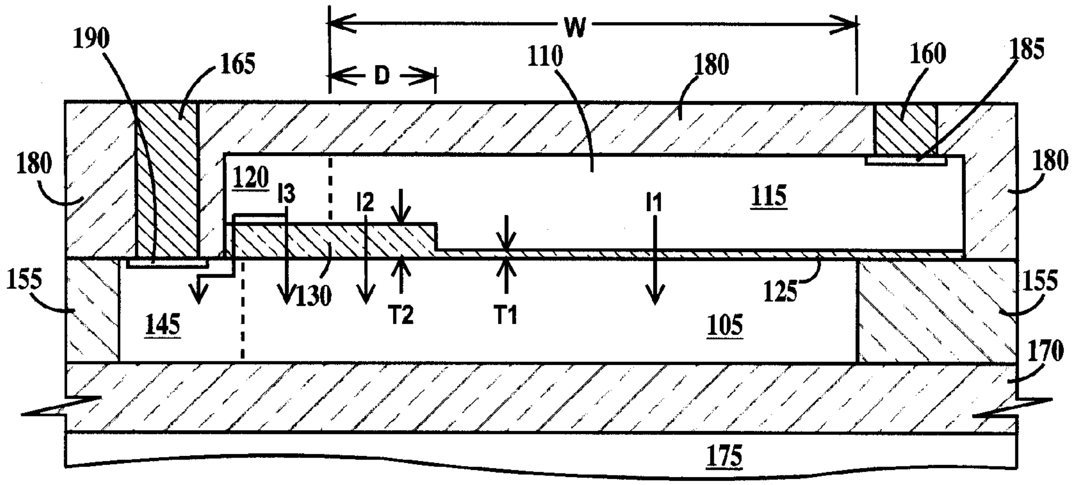
FIG. 1B is a cross-section through line 1B—1B of FIG. 1A.
Figure 1C:
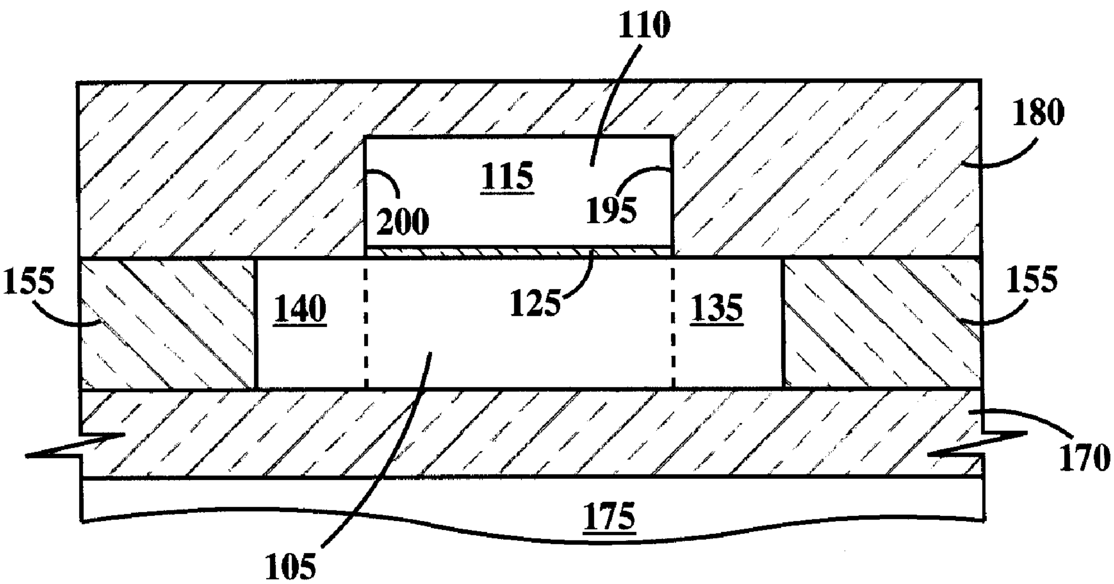
FIG. 1C is a cross-section through line 1C—1C of FIG. 1A.

FIG. 1B is a cross-section through line 1B—1B of FIG. 1A. In FIG. 1B, trench isolation 155 physically contacts a buried oxide layer (BOX) 170. BOX 170 in turn physically contacts a silicon substrate 175. Thus body 105 is electrically isolated from silicon substrate 175 or any adjacent devices. In FIG. 1B, an interlevel dielectric layer 180 is formed over conductive layer 110 and stud first and second contacts 160 and 165 extend through interlevel dielectric layer 180. An optional metal silicide contact 185 is formed between first stud contact 160 and conductive layer 110 and an optional metal silicide contact 190 is formed between second stud contact and body contact region 145. Examples of metal silicides include titanium silicide, tantalum silicide, tungsten silicide, platinum silicide and cobalt silicide.

Thin dielectric region 125 has a thickness T1 and thick dielectric region 130 has a thickness T2. In one example T1 is between about 0.8 nm and about 1.5 nm. In one example T2 is between about 2 nm and about 3 nm. Thin dielectric region 125 may comprise silicon dioxide, silicon nitride, a high K material, metal oxides, $Ta_2O_5$, $BaTiO_3$, $HfO_2$, $ZrO_2$, $Al_2O_3$, metal silicates, $HfSi_xO_y$, $HfSi_xO_yN_z$ and combinations thereof. Thick dielectric region 130 may also comprise silicon dioxide, silicon nitride, a high K material, metal oxides, $Ta_2O_5$, $BaTiO_3$, $HfO_2$, $ZrO_2$, $Al_2O_3$, metal silicates, $HfSi_xO_y$, $HfSi_xO_yN_z$ and combinations thereof. Thick and thin dielectric regions 125 and 130 may comprise the same or different materials. A high K dielectric material has a relative permittivity above 10.

There are three tunneling current leakage paths from conductive layer 110 into body 105. The first leakage path (for tunneling leakage current $I_1$) is from first region 115 of conductive layer 110, through thin dielectric region 125 to body 105. The second leakage path (for tunneling leakage current $I_2$) is from first region 115 of conductive layer 110, through thick dielectric region 130 to body 105. The third leakage path (for tunneling leakage current $I_3$) is from second region 120 of conductive layer 110, through thick dielectric region 130 to body 105 and body contact region 145.

Figure 1D:
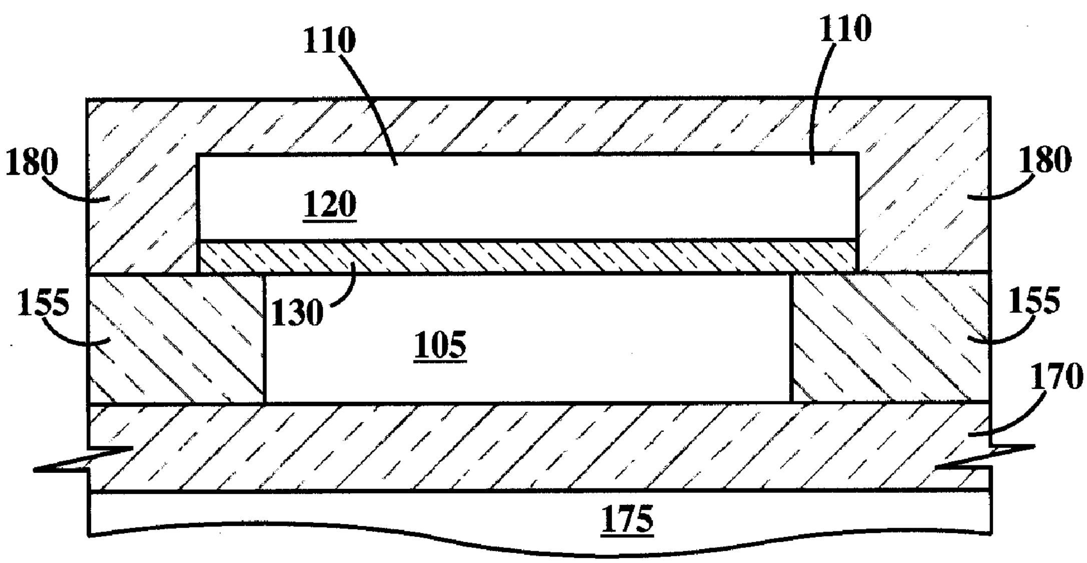
FIG. 1D is a cross-section through line 1D—1D of FIG. 1A.

FIG. 5C is a cross-section through line 1C—1C of FIG. 1A. In FIG. 5C, first and second source/drains 135 and 140 are aligned to opposite sidewalls 195 and 200 respectively of first region 115 of conductive layer 110. For clarity, no spacers are illustrated in FIG. 5C (or FIGS. 1A, 1B or 1D), however, the invention is applicable to devices fabricated with spacers. Spacers are thin layers formed on the sidewalls of gate electrodes and source/drains are aligned to the exposed sidewall of the spacer rather than the sidewall of the gate electrode as is well known in the art.

FIG. 5D is a cross-section through line 1D—1D of FIG. 1A. In FIG. 5D, it should be noted that thick dielectric region 130 does not extend under all of second region 120 of conductive layer 110.

Returning to FIGS. 1A and 1B, gate tunneling leakage current density J is a function of the dielectric layer material, the dielectric layer material and the voltage across the dielectric layer (for an FET this is VT). In the following discussion reference to both FIGS. 1A and 1B will be helpful. The total gate to body tunneling leakage current $I_{GB}$ (hereafter gate tunneling leakage) of FET 100 is equal to $I_1+I_2+I_3$ as shown in FIG. 1B. The tunneling leakage current density of thin dielectric region 125 is, $J_1$ and of thick dielectric region 130 is $J_2$. In general, gate tunneling leakage current I is equal to J times the area of the dielectric in a particular region. Therefore, gate tunneling leakage current $I_1$ is equal to $J_1 \cdot L(W-D)$. Gate tunneling leakage 12 is equal to$J_2$ ·L·D. Gate tunneling leakage 13 is equal to $J_2 \cdot A \cdot B$. (A is shown in FIG. 1A.) The total gate tunneling leakage of SOI FET 100 is given by:

$$I_{GB}=L_1 \cdot L(W-D)+J_2 \cdot L \cdot D+J_2 \cdot A \cdot B \quad (1)$$

When used as a measurement structure, SOI FET 100 is designed so that 13 remains constant, and the relations L−(W−D)>L·D and T2>T1 are chosen to make $I_1>I_2$.

Figure 2:
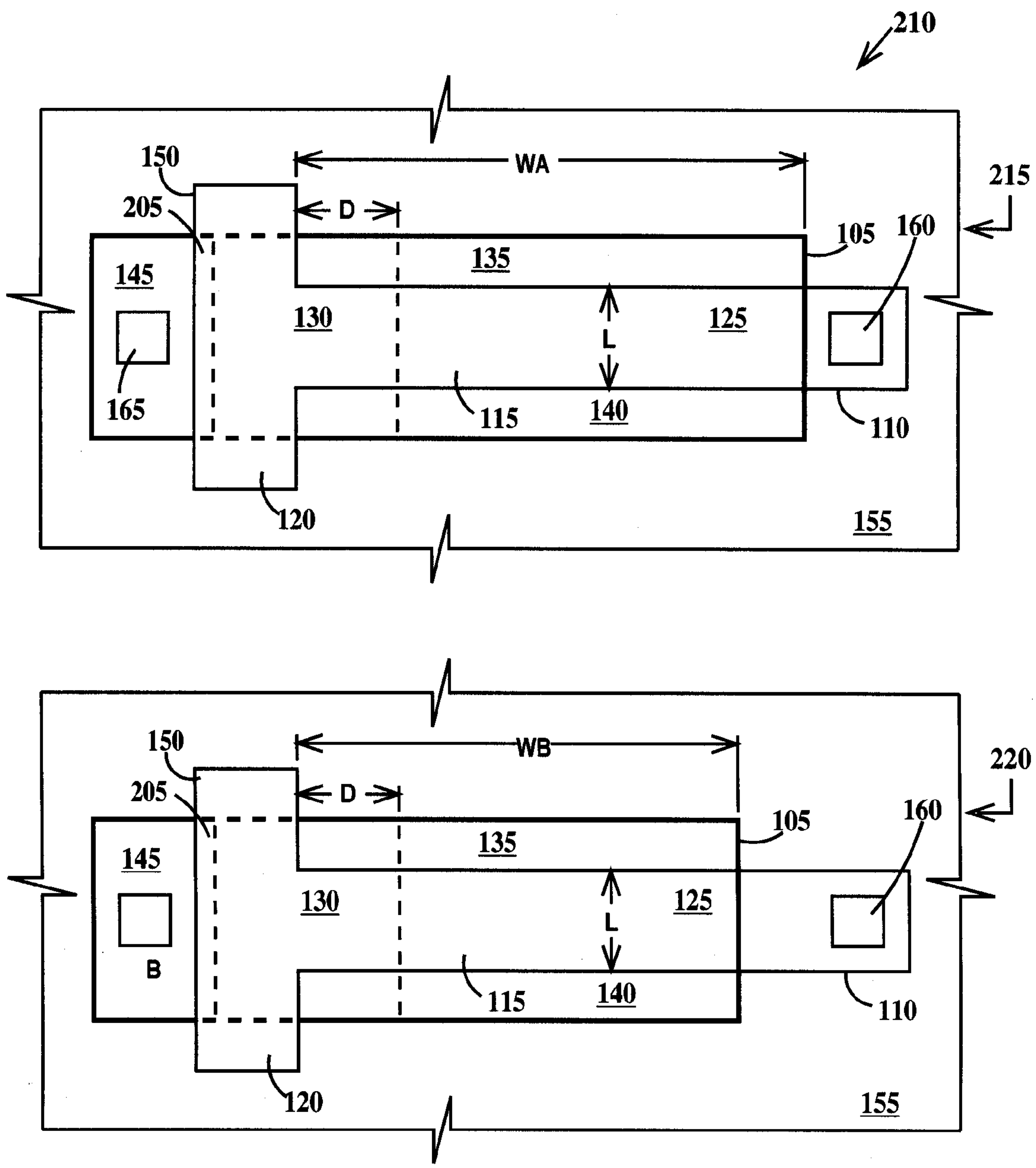
FIG. 2 is a top view of an exemplary tunneling gate current measure structure according to the first embodiment of the present invention.

FIG. 2 is a top view of an exemplary tunneling gate current measure structure according to the first embodiment of the present invention. In FIG. 2, a test structure 210 includes a first SOI FET 215 and a second SOI FET 220. First SOI FET 215 is similar to SOI FET 100 of FIG. 1A, except first region 115 of conductive layer 110 has a width WA as opposed to a width W in FIG. 1A. Second SOI FET 220 is similar to first SOI FET 215 except first region 115 of conductive layer 110 has a width WB as opposed to a width WA. In the first embodiment of the present invention WA can not be equal to WB, the goal being having two otherwise identical SOI FETs with different thin dielectric areas.

The total gate tunneling leakage current of SOI FET 215 (assuming the current through second region 120 of conductive layer 110 is negligible as discussed supra in reference to FIGS. 1A and 1B) can be expressed as $I_{GBA}=I_{1A}+I_{2A}+I_{3A}$ where $I_{1A}=J_1 \cdot L(WA-D)$, $I_{2A}=J_2 \cdot L \cdot D$ and $I_{3A}=J_2 \cdot A \cdot B$ to give:

$$I_{GBA}=J_1 \cdot L(WA-D)+J_2 \cdot L \cdot D+J_2 \cdot A \cdot B \quad (2)$$

and the total gate tunneling leakage current of SOI FET 220 can be expressed as $I_{GBB}=I_{1B}+I_{2B}+I_{3B}$ where $I_{1B}=J_1 \cdot L(WB-D)$, $I_{2A}=J_2 \cdot L \cdot D$, and $I_{3A}=J_2 \cdot A \cdot B$ to give:

$$I_{GBB}=J_1 \cdot L(WB-D)+J_2 \cdot L \cdot D+J_2 \cdot A \cdot B \quad (3)$$

and subtracting $I_{GBA}$ from $I_{GBB}$ and rearranging gives:

$$I_{GBA}-I_{GBB}=J_1 \cdot L(WA-WB). \quad (4)$$

Since both $I_{GBA}$ and $I_{GBB}$ may be measured by applying a voltage across and then measuring a current flowing through stud contacts 160 and 165 and with WA, WB, A and B as known values (design value plus fabrication bias) $J_1$ can be solved for. With $J_1$ known, $I_1$ for any SOI FET having a same thin dielectric layer as thin dielectric region 125 can be calculated. $J_2$ and $I_2$ may then be calculated as well. $I_{GBA}$ and $I_{GBB}$ are measured at the same voltage. In one example, $I_{GBA}$ and $I_{GBB}$ are measured at the threshold voltage (VT) of a conventional (single thickness gate dielectric) SOI FET.

Figure 3:
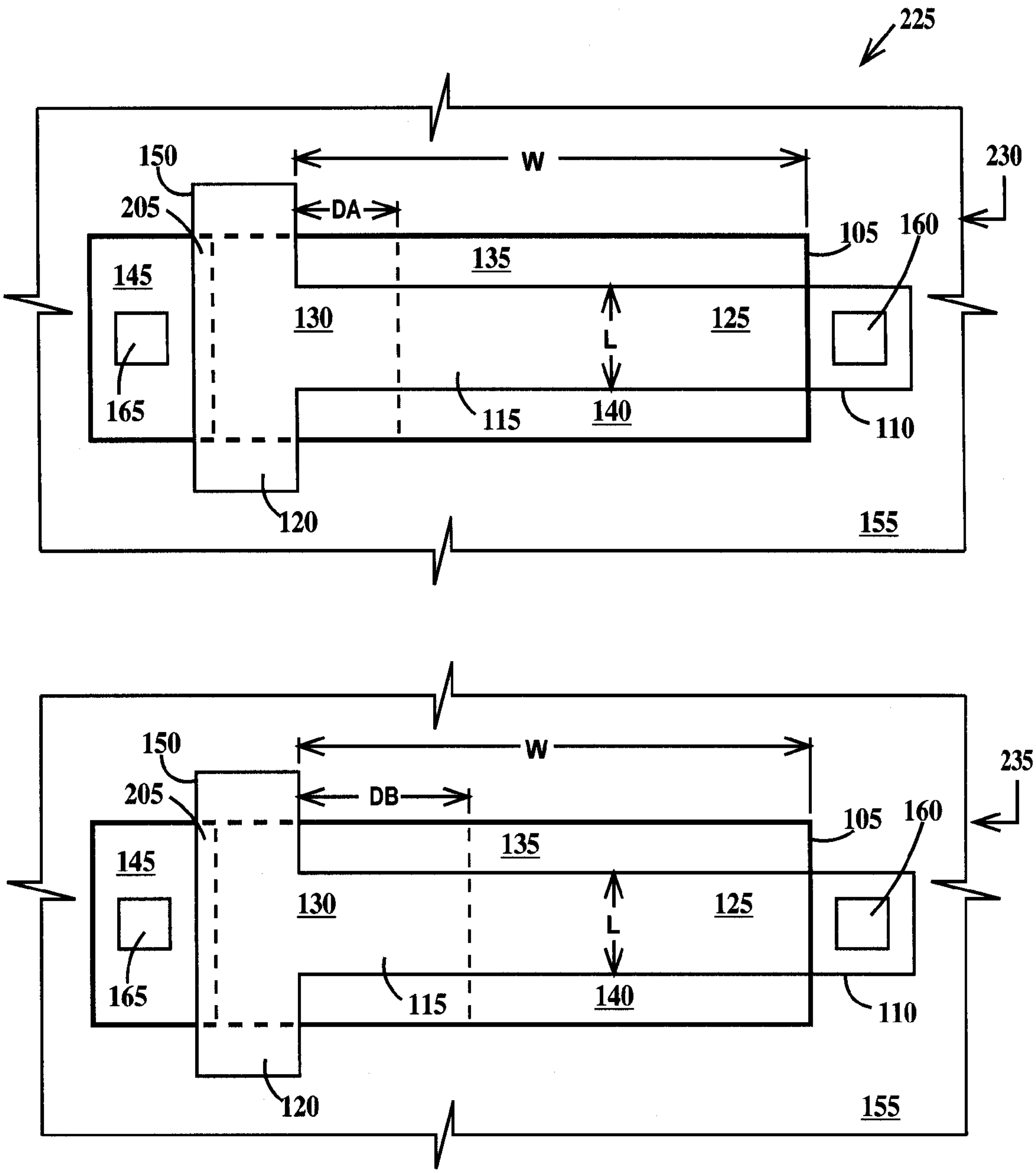
FIG. 3 is a top view of an exemplary tunneling gate current measure structure according to a second embodiment of the present invention.

FIG. 3 is a top view of an exemplary tunneling gate current measure structure according to a second embodiment of the present invention. In FIG. 3, a test structure 225 includes a first SOI FET 230 and a second SOI FET 235. First SOI FET 230 is similar to SOI FET 100 of FIG. 1A, except thick dielectric region 130 extends from second region 120 of conductive layer 110 a distance DA under first region 115 of conductive layer 110 (e.g. a region of thick dielectric region 130 under second region 120 of conductive layer 110 has a width DA) as opposed to a distance D in FIG. 1A. Second SOI FET 235 is similar to first SOI FET 230 except thick dielectric region 130 extends from second region 120 of conductive layer 110 a distance DB (e.g. a region of thick dielectric region 130 under second region 120 of conductive layer 110 has a width DA) under first region 115 of conductive layer 110 as opposed to distance DA. In the second embodiment of the present invention DA can not be equal to DB, the goal being having two otherwise identical SOI FETs with different thin dielectric areas.

The total gate tunneling leakage current of SOI FET 230 can be expressed as $I_{GBA}=I_{1A}+I_{2A}+I_{3A}I_{1A}=J_1\cdot L(W-DA)$, $I_{2A}=J_2\cdot L\cdot Dl$ , and $I_{3A}=J_2\cdot A\cdot B$ to give:

$$I_{GBA}=J_1\cdot L(W-DA)+J_2\cdot L\cdot DA+J_2\cdot A\cdot B \quad (5)$$

and the total gate tunneling leakage current of SOI FET 235 can be expressed as $I_{GBB}=I_{1B}-I_{1B}$ where $I_{1B}=J_1\cdot L(W-DB)$, $I_{1B}=J_2\cdot L\cdot DB$, and $I_{1A}=J_2\cdot A\cdot B$, to give:

$$I_{GBB}=J_1-L(W-DB)+J_2\cdot L\cdot DB+J_2\cdot A\cdot B. \quad (6)$$

Since both $I_{GBA}$ and $I_{GBB}$ may be measured by applying a voltage across and then measuring a current flowing through stud contacts 160 and 165 and with L, W, DA, and DB, A, B as known values (design value plus fabrication bias) and equations (5) and (6) provide two equations with two unknowns, $J_1$ and $J_2$ can be solved for. With, $J_1$ and $J_2$ known, $I_1$ and $I_2$ for any SOI FET having a same thin dielectric layer as thin dielectric region 125 can be calculated.

Figure 4A:
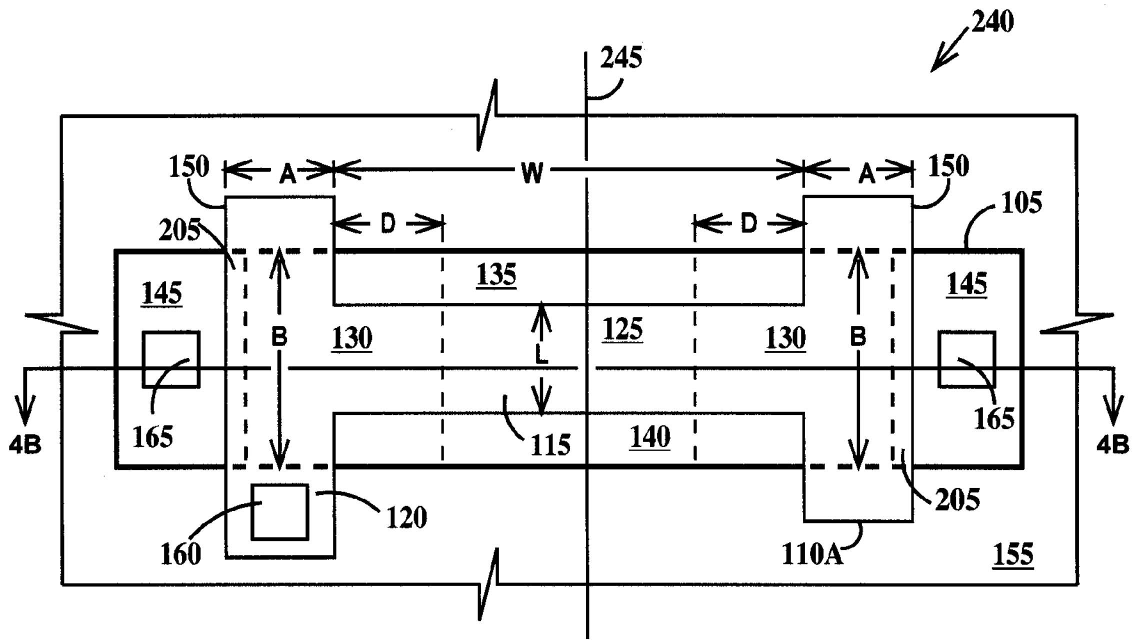
FIG. 4A is a top view of an SOI FET according to third and fourth embodiments of the present invention.

FIG. 4A is a top view of an SOI FET according to third and fourth embodiments of the present invention. In FIG. 4A, an SOI FET 240 is similar to SOI FET of FIG. 1A with the following exceptions:

SOI FET 240 is essentially symmetrical about a central axis 245 passing through and perpendicular to both body 105 and a conductive layer 110A is "H" shaped. First region 115 of conductive layer 110A is positioned between integral second and third regions 120 that perpendicular to first region 115. Thin dielectric region 125 is positioned between first and second thick dielectric layers 130 (defined by the dashed lines). First and second body contact regions 145 are formed in body 105 adjacent to a sides 150 of first and second regions 120 of gate 110A. A first stud contact 160 contacts gate 110 and a first and second stud contacts 165 contact body contact regions 145. First region 115 of conductive layer 110A has a width W and a length L. Thick dielectric region 130 extends from first and second regions 120 of conductive layer 110A distances D under first region 115 of conductive layer 110A.

When used a s measurement structure, SOI FET 240 is designed so that 13 remains constant, and L-(W-D)>L·D and T2>T1 making $I_1>I_2$.

Figure 4B:
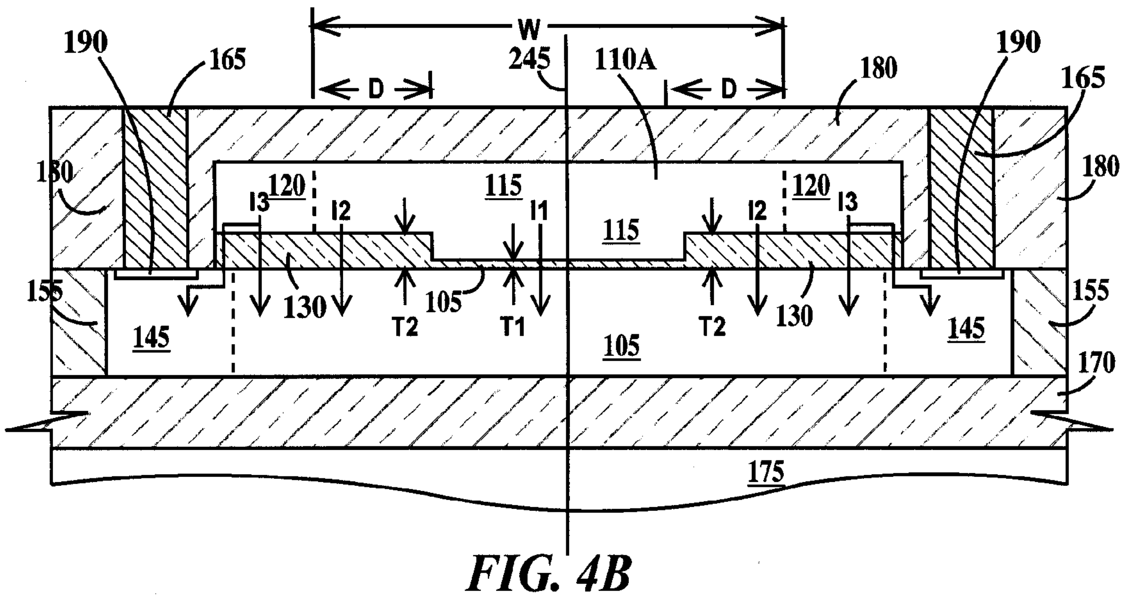
FIG. 4B is a cross-section through line 4B—4B of FIG. 4A.

FIG. 4B is a cross-section through line 4B—4B of FIG. 4A. In FIG. 4B, there are five tunneling current leakage paths from conductive layer 110A into body 105. The first leakage path (for tunneling leakage current $I_1$) is from first region 115 of conductive layer 110, through thin dielectric region 125 to body 105. The second and third leakage paths (for tunneling leakage currents 12) are from first region 115 of conductive layer 110, through first and second thick dielectric layers 130 to body 105. The fourth and fifth leakage path (for tunneling leakage currents 13) are from second and third regions 120 of conductive layer 110, through respective first and second thick dielectric layers 130 to body 105 and respective body contact regions 145.

Figure 5:
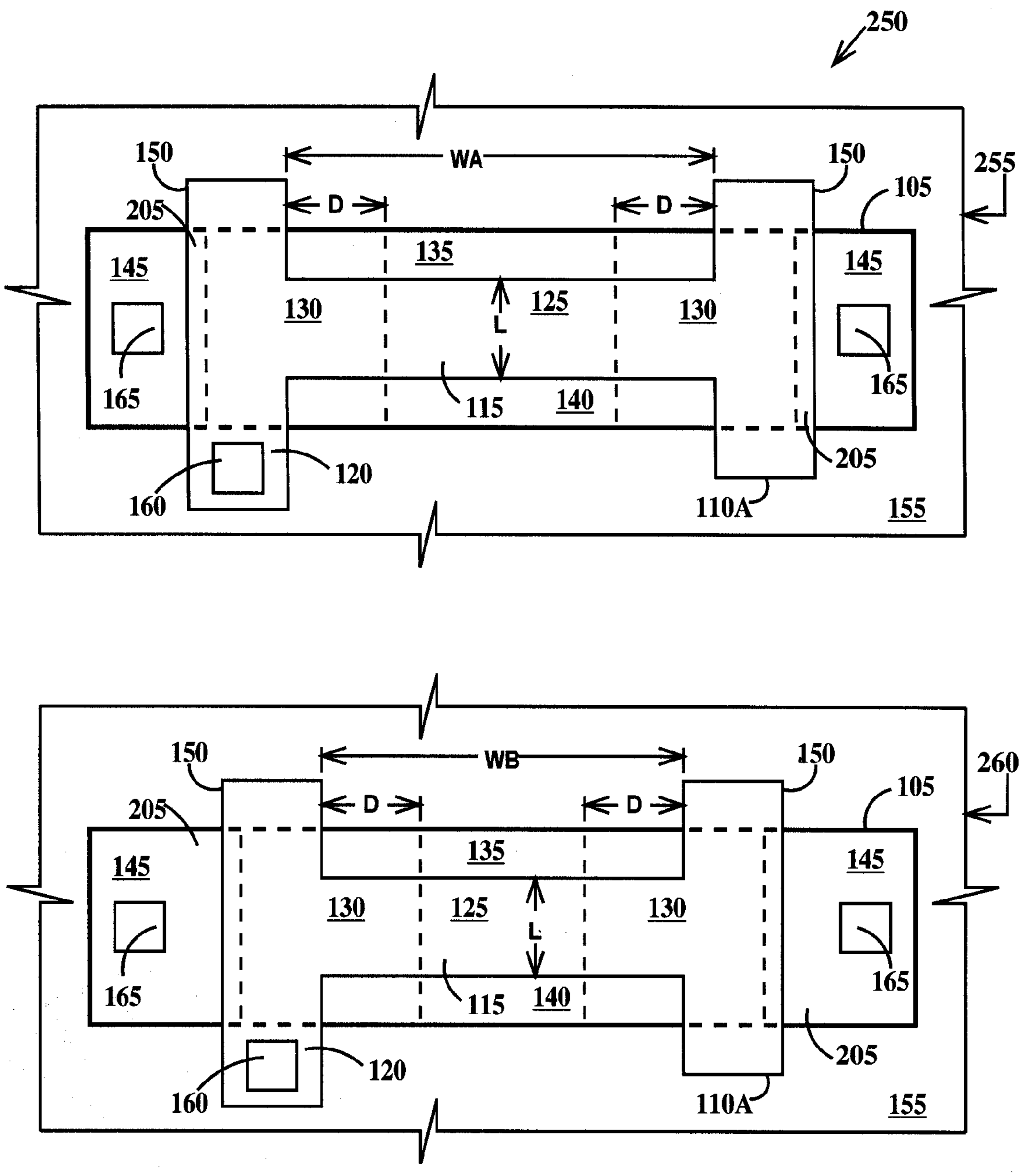
FIG. 5 is a top view of an exemplary tunneling gate current measure structure according to the third embodiment of the present invention.

FIG. 5 is a top view of an exemplary tunneling gate current measure structure according to the third embodiment of the present invention. In FIG. 5, a test structure 250 includes a first SOI FET 255 and a second SOI FET 260. First SOI FET 250 is similar to SOI FET 240 of FIG. 4A, except first region 115 of conductive layer 110 has a width WA as opposed to a width W in FIG. 4A. Second SOI FET 260 is similar to first SOI FET 255 except first region 115 of conductive layer 110A has a width WB as opposed to a width WA. In the third embodiment of the present invention WA can not be equal to WB, the goal being having two otherwise identical SOI FETs with different thin dielectric areas.

Equation (1) $I_{GBA}-I_{GBB}=J_1L(WA-WB)$ derived for the first embodiment of the present invention is applicable to the third embodiment of the present invention. The third embodiment of the present invention eliminates errors in gate tunneling leakage induced at the edge of body 105 under gate 110 of FIG. 2 by eliminating that edge.

Again both $I_{GBA}$ and $I_{GBB}$ are measured by applying a voltage across and then measuring a current flowing through stud contacts 160 and 165 and in one example, $I_{GBA}$ and $I_{GBB}$ are measured at the threshold voltage (VT) of a conventional (single thickness gate dielectric) SOI FET.

Figure 6:
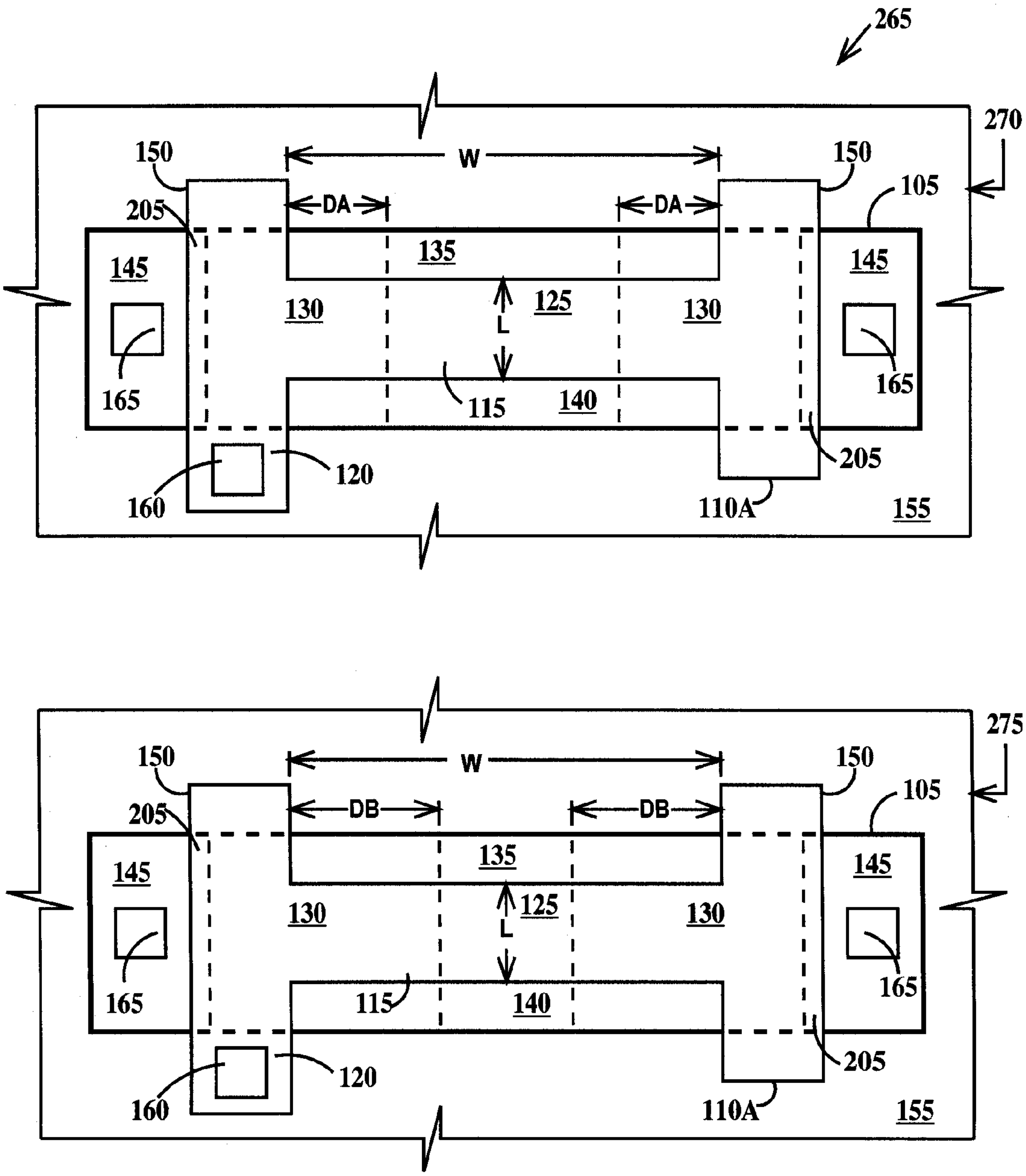
FIG. 6 is a top view of an exemplary tunneling gate current measure structure according to the fourth embodiment of the present invention.

FIG. 6 is a top view of an exemplary tunneling gate current measure structure according to the fourth embodiment of the present invention. In FIG. 6, a test structure 265 includes a first SOI FET 270 and a second SOI FET 275. First SOI FET 270 is similar to SOI FET 240 of FIG. 4A, except thick dielectric layers 130 extend from second and third regions 120 of conductive layer 110A distances DA under either side of first region 115 of conductive layer 110A as opposed to a distance D in FIG. 4A. Second SOI FET 275 is similar to first SOI FET 270 except thick dielectric region 130 extends from second and third regions 120 of conductive layer 110A distances DB under either side of first 115 of conductive layer 110A as opposed to distance DA. In the fourth embodiment of the present invention DA can not be equal to DB, the goal being having two otherwise identical SOI FETs with different thin dielectric areas.

The following two equations in two unknowns, $J_1$ and $J_2$ may be derived in a similar manner to equations (5) and (6) supra:

$$I_{GBA}=J_1\cdot L(W-DA)+2\cdot J_2\cdot L\cdot DA+2\cdot J_2\cdot A\cdot B \quad (7)$$

$$I_{GBA}=J_1\cdot L(W-DB)+2\cdot J_2\cdot L\cdot DB+2\cdot J_2\cdot A\cdot B. \quad (8)$$

Again both $I_{GBA}$ and $I_{GBB}$ are measured by applying a voltage across and then measuring a current flowing through stud contacts 160 and 165 and in one example, $I_{GBA}$ and $I_{GBB}$ are measured at the threshold voltage (VT) of a conventional (single thickness gate dielectric) SOI FET.

The fourth embodiment of the present invention eliminates errors in gate tunneling leakage induced at the edge of body 105 under gate 110 of FIG. 3 by eliminating that edge.

Thus, the present invention provides a silicon-on-insulator field effect transistor with reduced non-channel gate to body leakage and a structure and method for measuring tunnel leakage current of silicon-on-insulator field effect transistors.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure comprising:

a silicon body formed in a semiconductor substrate;

a dielectric layer on a top surface of said silicon body; and a conductive layer on a top surface of said dielectric layer, a first region of said dielectric layer between said conductive layer and said top surface of said silicon body having a first thickness and a second region of said dielectric layer between said conductive layer and said top surface of said silicon body having a second thickness, said first thickness different from said second thickness.

2. The structure of claim 1, further including dielectric isolation extending from a top surface of said semiconductor substrate into said semiconductor substrate on all sides of said silicon body.

3. The structure of claim 2, further including a buried dielectric layer in said semiconductor substrate under said silicon body, said dielectric isolation contacting said buried dielectric layer.

4. The structure of claim 1, wherein:

a first region of said conductive layer extends in a first direction and a second region of said conductive layer extends in a second direction, said second direction perpendicular to said first direction; and said first region of said conductive layer disposed over said first region of said dielectric layer and an adjacent first portion of said second region of said dielectric layer, said second region of said conductive layer disposed over a second portion of said second region of said dielectric layer, said second portion of said second region of said dielectric layer adjacent to said first portion of said second region of said dielectric layer.

5. The structure of claim 4, wherein:

said first thickness being less than said second thickness;

an area of said first portion of said second region of said dielectric layer being larger than an area of said second portion of said second region of said dielectric layer; and an area of said first region of said dielectric layer being larger than an area of said second portion of said second region of said dielectric layer.

6. The structure of claim 4, further including:

a body contact region in an end of said silicon body adjacent to said second region of said conductive layer.

7. The structure of claim 4, further including source/drain regions in said silicon body and extending in said first direction on opposite sides of said first region of said conductive layer.

8. The structure of claim 4, wherein:

said dielectric layer includes a third region having said second thickness, said first region of said dielectric layer disposed between said second and third regions of said dielectric layer;

said conductive layer includes a third region, said third region extending in said second direction, said second region of said dielectric disposed between said first and third regions of said conductive layer; and said first region of said conductive layer further disposed over a first portion of said third region of said dielectric layer, said first portion of said third region of said dielectric layer adjacent to said first region of said dielectric layer, said third region of said conductive layer disposed over a second portion of said third region of said dielectric layer, said second portion of said third region of said dielectric layer adjacent to said first portion of said third region of said dielectric layer.

9. The structure of claim 8, further including:

a first body contact region in a first end of said silicon body adjacent to said second region of said conductive layer; and a second body contact region in a second end of said silicon body adjacent to said third region of said conductive layer.

10. The structure of claim 8, wherein:

said first thickness being less than said second thickness;

an area of said first portion of said second region of said dielectric layer being larger than an area of said second portion of said second region of said dielectric layer;

an area of said first region of said dielectric layer being larger than an area of said second portion of said second region of said dielectric layer;

an area of said first portion of said third region of said dielectric layer being larger than an area of said second portion of said third region of said dielectric layer; and an area of said first region of said dielectric layer being larger than an area of said second portion of said third region of said dielectric layer.

11. The structure of claim 8, further including source/drain regions in said silicon body and extending in said first direction on opposite sides of said first region of said conductive layer.

12. The structure of claim 1, wherein said first region and said second region of said dielectric layer comprise materials selected from the from the group comprising silicon dioxide, silicon nitride, metal oxides, $Ta_2O_5$, $BaTiO_3$, $HfO_2$, $ZrO_2$, $Al_2O_3$, metal silicates, $HfSi_xO_y$, $HfSi_xO_yN_z$ a high K dielectric material having a relative permittivity above 10 and combinations thereof.

13. The structure of claim 1, wherein said first thickness is between about 8 nm and about 1.5 nm and said second thickness is between about 2 nm and about 3 nm.

14. The structure of claim 1, wherein said semiconductor substrate comprises a silicon-on-insulator substrate.

15. A method of measuring leakage current, comprising:

providing a first and a second device, each device comprising:

a silicon body formed in a semiconductor substrate;

a dielectric layer on a top surface of said silicon body, a first region of said dielectric layer having a first thickness and a second region of said dielectric layer having a second thickness, said first thickness less than said second thickness;

a conductive layer on a top surface of said dielectric layer;

a dielectric isolation extending from a top surface of said semiconductor substrate into said semiconductor substrate on all sides of said silicon body;

a buried dielectric layer in said semiconductor substrate under said silicon body, said dielectric isolation contacting said buried dielectric layer;

a first region of said conductive layer extending in a first direction and a second region of said conductive layer extending in a second direction, said second direction perpendicular to said first direction; and said first region of said conductive layer disposed over said first region of said dielectric layer and an adjacent first portion of said second region of said dielectric layer, said second region of said conductive layer disposed over a second portion of said second region of said dielectric layer, said second portion of said second region of said dielectric layer adjacent to said first portion of said second region of said dielectric layer; and performing measurements of current flow between said conductive layer and said silicon body for each of said first and second devices.

16. The method of claim 15, wherein for both said first and said second devices:

an area of said first portion of said second region of said dielectric layer being larger than an area of said second portion of said second region of said dielectric layer; and an area of said first region of said dielectric layer being larger than an area of said second portion of said second region of said dielectric layer.

17. The method of claim 15, wherein:

an area of said first portion of said second region of said dielectric layer of said first device being different from an area of said first portion of said second region of said dielectric layer of said second device; and an area of said first region of said conductive layer of said first device being about equal to an area of said first region of said conductive layer of said second device.

18. The method of claim 17, further including:

determining a tunneling leakage current density, $J_1$ of said first region of said dielectric layer of each of said first and second devices from said current flow measurements using the formula:

$$J_1=(I_{GBA}-I_{GBB})/L(WA-WB)$$

where $I_{GBA}$ is an amount of current measured between said conductive layer and said silicon body of said first device, $I_{GBB}$ is an amount of current measured between said conductive layer and said silicon body of said second device, L is a length of either said first region of said conductive layer of said first or of said second device, WA is a width of said first region of said conductive layer of said first device, and WB is a width of said first region of said conductive layer of said second device.

19. The method of claim 18, further including:

determining a tunneling leakage current $I_{1A}$ of said first region of said dielectric layer of said first device from said current flow measurement using the formula:

$$I_{1A}=J_1 \cdot L(WA-D)$$

where D is a width of said first portion of said second region of said dielectric layer of said first device.

20. The method of claim 15, wherein:

an area of said first portion of said second region of said dielectric layer of said first device being about equal to an area of said first portion of said second region of said dielectric layer of said second device; and an area of said first region of said conductive layer of said first device being different from an area of said first region of said conductive layer of said second device.

21. The method of claim 20, further including:

determining a tunneling leakage current density, $J_1$ of said first region of said dielectric layer of each of said first and said second device from said current flow measurement using the formulas:

$$I_{GBA}=J_1 \cdot L(W-DA)+J_2 \cdot L \cdot DA+J_2 \cdot A \cdot B \text{ and } I_{GBB}=J_1 \cdot L(W-DB)+J_2 \cdot L \cdot DB+J_2 \cdot A \cdot B$$

where $I_{GBA}$ is the amount of current measured between said conductive layer and said silicon body of said first device, $I_{GBB}$ is the amount of current measured between said conductive layer and said silicon body of said second device, L is a length of each of said first regions of said conductive layers of said first and said second devices, W is a width of each of said first regions of said conductive layers of said first and second devices, DA is a width of said first portion of said second region of said dielectric layer of said first device, DB is a width of said first portion of said second region of said dielectric layer of said second device, and $J_2$ is a tunneling leakage current density of each of said second regions of said dielectric layers said first and said second devices.

22. The method of claim 21, further including:

determining a tunneling leakage current $I_{1A}$ of said first region of said dielectric layers of said first device from said current flow measurement using the formula:

$$I_{1A}=J_1 \cdot L(W-DA).$$

23. The method of claim 15, wherein for both said first and second devices:

said dielectric layer includes a third region having said second thickness, said first region of said dielectric layer disposed between said second and third regions of said dielectric layer;

said conductive layer includes a third region, said third region extending in said second direction, said first region of said dielectric disposed between said first and third regions of said conductive layer; and said first region of said conductive layer further disposed over a first portion of said third region of said dielectric layer, said first portion of said third region of said dielectric layer adjacent to said first region of said dielectric layer, said third region of said conductive layer disposed over a second portion of said third region of said dielectric layer, said second portion of said third region of said dielectric layer adjacent to said first portion of said third region of said dielectric layer.

24. The method of claim 23, wherein for both said first and said second devices:

an area of said first portion of said second region of said dielectric layer being larger than an area of said second portion of said second region of said dielectric layer;

an area of said first region of said dielectric layer being larger than an area of said second portion of said second region of said dielectric layer;

an area of said first portion of said third region of said dielectric layer being larger than said second portion of said third region of said dielectric layer; and an area of said first region of said dielectric layer being larger than an area of said second portion of said third region of said dielectric layer.

25. The method of claim 23, wherein:

an area of said first portion of said second and third region of said dielectric layer of said first device being about equal to an area of said first portion of said second and third region of said dielectric layer of said second device; and an area of said first region of said conductive layer of said first device being about equal to an area of said first region of said conductive layer of said second device.

26. The method of claim 25, further including:

determining a tunneling leakage current density, $J_1$ of said first regions of said dielectric layers of each of said first and second devices from said current flow measurements using the formula:

$$J_1=(I_{GBA}-I_{GBB})/L(WA-WB)$$

where $I_{GBA}$ is an amount of current measured between said conductive layer and said silicon body of said first device, $I_{GBB}$ is an amount of current measured between said conductive layer and said silicon body of said second device, L is a length of said first regions of said conductive layers of each of said first and said second devices, WA is a width of said first region of said conductive layer of said first device, and WB is a width of said first region of said conductive layer of said second device.

27. The method of claim 26, further including:

determining a tunneling leakage current $I_{1A}$ of said first region of said dielectric layer of said first device from said current flow measurement using the formula:

$$I_{1A}=J_1\cdot L(WA-D)$$

where D is a width of said first portion of said second and third regions of said dielectric layer of said first device.

28. The method of claim 18, wherein:

areas of said first portions of said second and third regions of said dielectric layers being about equal in any one of said two or more devices but different in each device of said two more devices; and areas of said first regions of said conductive layers being different.

29. The method of claim 28, further including:

determining a tunneling leakage current density, $J_1$ of said first region of said dielectric layer of said first or said second device from said current flow measurement using the formulas:

$$I_{GBA}=J_1\cdot L(W-DA)+J_2\cdot L\cdot DA+J_2\cdot A\cdot B \text{ and } I_{GBB}=J_1\cdot L(W-DB)+J_2\cdot L\cdot DB+J_2\cdot A\cdot B$$

where $I_{GBA}$ is the amount of current measured between said conductive layer and said silicon body of said first device, $I_{GBB}$ is the amount of current measured between said conductive layer and said silicon body of said second device, L is a length of each of said first regions of said conductive layers of said first and said second devices, W is a width of each of said first regions of said conductive layers of said first and second devices, DA is a width of said first portion of said second region of said dielectric layer of said first device, DB is a width of said first portion of said second region of said dielectric layer of said second device, and $J_2$ is a tunneling leakage current density of each of said second regions of said dielectric layers said first and said second devices.

30. The method of claim 29, further including: determining a tunneling leakage current $I_{1A}$ of said first region of said dielectric layer of said first device from said current flow measurement using the formula:

$$I_{1A}=J_1\cdot L(W-DA).$$

31. A method of measuring leakage current, comprising:

providing a first device, comprising:

a first silicon body formed in a semiconductor substrate;

a first dielectric layer on a top surface of said first silicon body; and a first conductive layer on a top surface of said first dielectric layer, a first region of said first dielectric layer between said first conductive layer and said top surface of said first silicon body having a first thickness and a first area and a second region of said dielectric layer between said first conductive layer and said top surface of said first silicon body having a second thickness and a second area, said first thickness different from said second thickness;

providing a second device, comprising:

a second silicon body formed in a semiconductor substrate;

a second dielectric layer on a top surface of said second silicon body; and a second conductive layer on a top surface of said second dielectric layer, a second region of said second dielectric layer between said second conductive layer and said top surface of said second silicon body having said first thickness and a third area and a second region of said dielectric layer between said second conductive layer and said top surface of said second silicon body having said second thickness and a fourth area, said second thickness greater than said first thickness;

applying a voltage between and measuring a first current flow between said first conductive layer and said first silicon body;

applying said voltage between and measuring a second current flow between said second conductive layer and said second silicon body; and determining a leakage current density of said first region of first dielectric layer, said second region of first dielectric layer, said second region of first dielectric layer, said second region of second dielectric layer or combinations thereof based on said first and second current measurements and said first, second, third and fourth areas.

32. The method of claim 31, wherein said first area is about equal to said third area and said second area is different from said fourth area.

33. The method of claim 31, wherein said first area is different from said third area and said second area is about equal to said fourth area.

* * * * *

UNITED STATES PATENT AND TRADEMARK OFFICE

CERTIFICATE OF CORRECTION

PATENT NO. : 7,011,980 B1 
APPLICATION NO. : 10/908351
DATED : March 14, 2006
INVENTOR(S) : Na et al.

It is certified that error appears in the above-identified patent and that said Letters Patent is hereby corrected as shown below:

Column 3,
Lines 61, 62 and 65, delete "5C" and insert -- 1C --.

Column 4,
Lines 4 and 5, delete "5D" and insert -- 1D --.
Line 11, delete "VT" and insert -- $V_T$ --.
Line 20, delete "12" and insert -- $I_2$ --.
Line 21, delete "13" and insert -- $I_3$ --.
Line 25, delete "$I_{GB}=L_1 \cdot L(W\text{-}D)+J_2 \cdot L \cdot D+J_2 \cdot A \cdot B$" and insert
-- $I_{GB}=J_1 \cdot L(W\text{-}D)+J_2 \cdot L \cdot D+J_2 \cdot A \cdot B$ --.
Line 28, delete "13" and insert -- $I_3$ --.
Line 67, delete "(VT)" and insert -- ($V_T$) --.

Column 5,
Line 22, delete "$I_{2A}=J_2 \cdot L \cdot D1$" and insert -- $I_{2A}=J_2 \cdot L \cdot DA$ --.
Lines 26-27, delete "$I_{GBB}=I_{1B}\text{-}I_{1B}$ where $I_{1B}=J_1 \cdot L(W\text{-}DB)$, $I_{1B}=J_2 \cdot L \cdot DB$, and $I_{1A}=J_2 \cdot A \cdot B$" and insert -- $I_{GBB}=I_{1B}+I_{2B}$ where $I_{1B}=J_1 \cdot L(W\text{-}DB)$, $I_{2B}=J_2 \cdot L \cdot DB$, and $I_{3A}=J_2 \cdot A \cdot B$ --.
Line 28, delete "$I_{GBB}=J_1\text{-}L(W\text{-}DB)+J_2 \cdot L \cdot DB+J_2 \cdot A \cdot B$" and insert
-- $I_{GBB}=J_1 \cdot L(W\text{-}DB)+J_2 \cdot L \cdot DB+J_2 \cdot A \cdot B$ --.

Column 6,
Line 1, delete "12" and insert -- $I_2$ --.
Line 4, delete "13" and insert -- $I_3$ --.
Lines 30 and 58, delete "(VT)" and insert -- ($V_T$) --.

Signed and Sealed this

Eleventh Day of July, 2006

JON W. DUDAS
*Director of the United States Patent and Trademark Office*